United States Patent [19]

Michalski

[11] 4,217,655

[45] Aug. 12, 1980

[54] CLOCK CIRCUIT HAVING A SWEPT OUTPUT FREQUENCY

[75] Inventor: Thomas F. Michalski, Maumee, Ohio

[73] Assignee: Owens-Illinois, Inc., Toledo, Ohio

[21] Appl. No.: 934,445

[22] Filed: Aug. 17, 1978

[51] Int. Cl.² .................................................. H03B 23/00
[52] U.S. Cl. .................................. 364/701; 307/271; 328/46; 364/703
[58] Field of Search ................. 364/701, 703, 721; 307/220 R, 271; 328/39, 46, 132, 150; 331/178

[56] References Cited

U.S. PATENT DOCUMENTS

| | | | |
|---|---|---|---|
| 3,621,403 | 11/1971 | Seiy | 328/46 X |
| 3,633,017 | 1/1972 | Crooke et al. | 364/721 |
| 3,739,374 | 6/1973 | Kiowski | 364/721 X |
| 3,840,814 | 10/1974 | Schiffman | 307/271 X |
| 3,870,963 | 3/1975 | Groce et al. | 307/271 X |
| 4,075,544 | 2/1978 | Leenhouts | 307/271 X |

*Primary Examiner*—Jerry Smith
*Attorney, Agent, or Firm*—D. T. Innis; M. E. Click; D. H. Wilson

[57] ABSTRACT

Disclosed is a digital circuit for generating a swept clock frequency having a linear rate of change. A constant frequency signal is divided by a counter signal representative of the inverse of a linearly changing time dependent variable. The value of the counter signal is varied at the proper rate by means of a pair of rate multipliers and a frequency divider. Included are means for controlling the slope of the output frequency.

4 Claims, 1 Drawing Figure

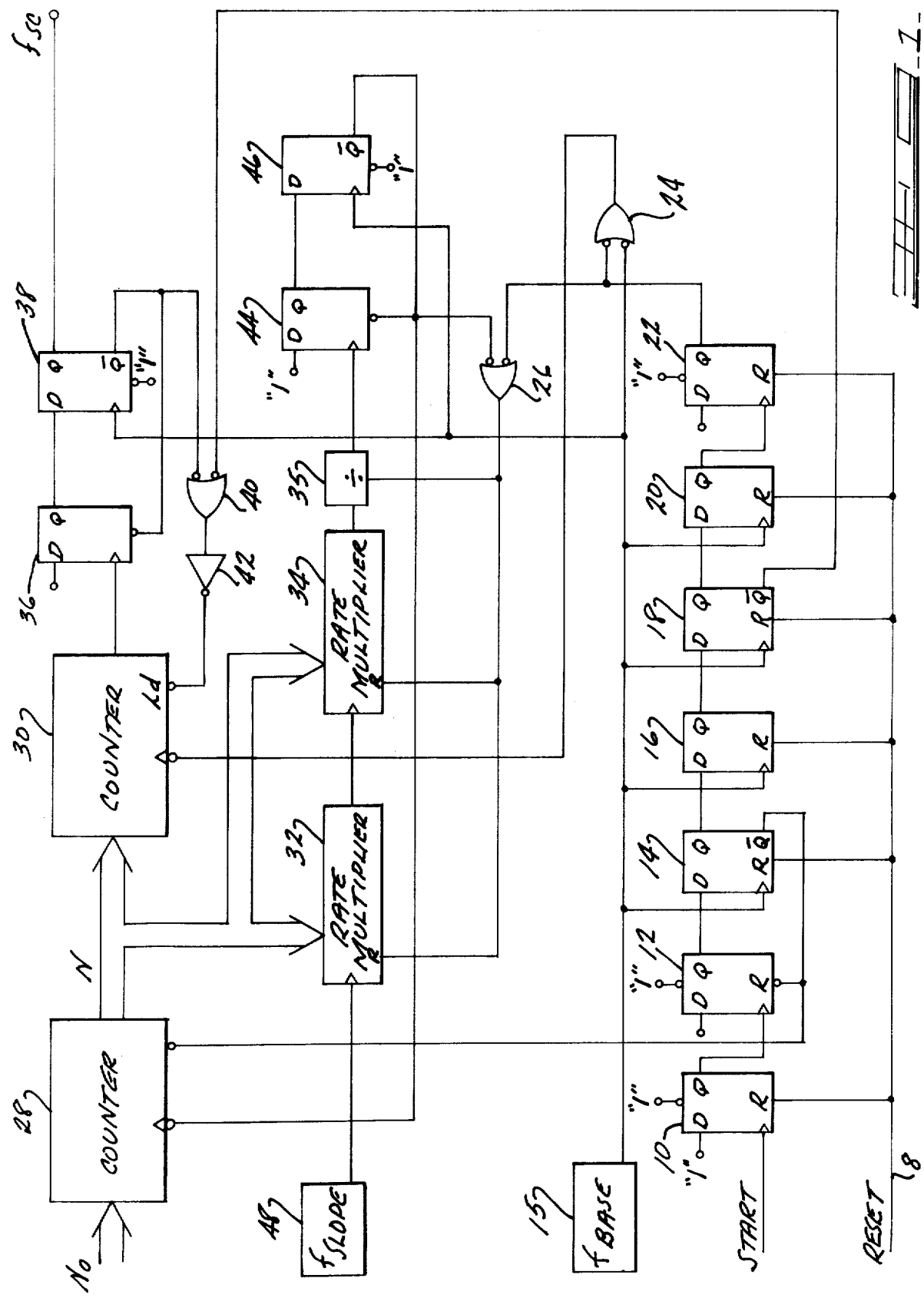

CLOCK CIRCUIT HAVING A SWEPT OUTPUT FREQUENCY

BACKGROUND OF THE INVENTION

This invention relates to devices for generating a swept clock frequency having a linear rate of change. More particularly, this invention relates to devices where the swept clock frequency is utilized to track a linearly changing time dependent variable where the value of the variable is known at only one point in time. Still more particularly, this invention relates to the provision of timing signals for causing successive measurements of a uniformly accelerating article to be made at equal and known increments in the motion of the article. Most particularly, this invention relates to the use of digital circuits to make a swept clock. In general, most devices have utilized analog circuits to generate a swept clock frequency. Such devices generally consist of a voltage controlled oscillator driven by a voltage which is ramped up or down at a predetermined rate in order to vary the frequency output of the oscillator. The degree of stability and accuracy of such circuits does not meet the requirements of certain applications. The present invention is designed to overcome these limitations by the use of digital circuits to generate a swept frequency.

SUMMARY OF THE INVENTION

According to the present invention, the number in a counter is caused to vary (i.e. the counter is caused to count) at a rate which corresponds to the rate of change of the inverse of a linearly changing time dependent variable. This is accomplished by feeding the output of the counter to a first rate multiplier which is clocked by a first constant frequency signal. The output of the first rate multiplier clocks a second rate multiplier, whose input is also the number from the counter. The output of the second rate multiplier is connected to a frequency divider which serves a smoothing function. The output of the frequency divider is used to clock the counter and cause the number in it to change at the desired rate. A second constant frequency signal is then divided by the number in the counter in order to obtain a linearly changing swept clock frequency output.

The initial value of the number in the counter may simply be a predetermined number, in which case the initial output frequency will be the same each time the circuit operates. Alternatively, the number loaded into the counter may be a measured value which is not necessarily the same each time the circuit operates. In its present embodiment, the invention is utilized in this second mode to control the timing of successive measurements of the width of different portions of an article which is moving with uniform acceleration. The inverse of the velocity of the article (i.e. time to travel a certain distance) is measured at a particular point and loaded into the counter (the velocity of the article is the linearly changing variable). The first constant frequency signal is set to a value which allows the slope of the swept clock output frequency to correspond to the value of the acceleration of the article. Each output pulse causes a width measurement to be made. Since the output pulses track the acceleration of the article, each measurement will be made at an equal increment in the motion of the article. In addition, since the initial output frequency (which is a function of the initial number in the counter) is a known proportion of the initial velocity, the distance between measurements is also known. When the next article is measured, a new initial value will be loaded into the counter which represents the inverse of the initial velocity of that article. The initial output frequency will be different than with the first article, but the ratio between the initial velocity and initial output frequency will be the same for both articles. The result of this is that all measurements will be made at equal increments in the motion of all articles, in spite of the fact that their initial velocities may differ. The circuit disclosed thus allows the generation of a swept clock frequency which is a known proportion of a linearly changing time dependent variable.

BRIEF DESCRIPTION OF THE DRAWING

The single drawing FIGURE is a schematic diagram of the circuit of the present invention.

DETAILED DESCRIPTION OF THE DRAWING

Referring to FIG. 1, a group of six flip flops 10, 14, 16, 18, 20 and 22 are initially reset by a signal generated along a line 8. A signal labeled "start" is then generated to the clock input of the flip flop 10. This sets the flip flop 10, and its Q output remains at logic "1" until the next reset signal is generated. The Q output of the flip flop 10 is connected to the clock input of a flip flop 12, whose output thus goes to "1" when the Q output of the flip flop 10 goes to "1". The Q output of the flip flop 12 is connected to the data input of the flip flop 14. The flip flop 14 is clocked by a clock 15 having a frequency of $f_{base}$. The frequency $f_{base}$ is a constant value frequency, and its value determines the zero time value of the output frequency. After the Q output of the flip flop 12 goes to "1" the next signal from the clock 15 will cause the Q output of the flip flop 14 to go to "1" and the $\bar{Q}$ output of the flip flop 14 to go to "0". The $\bar{Q}$ output of the flip flop 14 is connected to an inverted reset input of the flip flop 12 and to an inverted load input of a presettable down counter 28. Thus, when the $\bar{Q}$ output of the flip flop 14 goes to "0", the flip flop 12 is reset and the counter 28 is loaded with a number $N_o$, which is a digital measure of the variable being measured. In the present embodiment of the invention, for example, the width of an accelerating article is successively measured at equal increments in the motion of the article, and $N_o$ is a time measure proportional to the initial velocity of the article. The Q output of the flip flop 14 is connected to the data input of the flip flop 16. The flip flop 16 is also clocked by the clock 15, as are the flip flops 18 and 20.

Since the flip flop 12 is reset when the $\bar{Q}$ output of the flip flop 14 goes to "0", the output of the flip flop 12 is a pulse of relatively short duration. This pulse then "walks along" the flip flops 14, 16, 18 and 20 with each successive pulse from the clock 15 clocking the flip flops 14, 16, 18 and 20 in order. The first clock pulse which occurs after the output of flip flop 12 goes to "1" sets the flip flop 14. The next clock pulse sets the flip flop 16. The flip flop 16 serves a delay function and its Q output is connected to the D input of the flip flop 18. The third clock pulse sets the flip flop 18, thus passing a positive pulse from the Q output of the flip flop 18 and a negative pulse from the $\bar{Q}$ output of the flip flop 18. The Q output is connected to the D input of flip flop 20, and the $\bar{Q}$ output is connected to one input of an inverting input OR gate 40. The other input of the OR gate 40 is initially "1", so the negative pulse from the flip flop 18 causes the OR gate 40 to generate a positive pulse. The output of the OR gate 40 is connected to the input of an inverter 42, the output of which is connected to the inverted load input of a counter 30. The pulse from the flip flop 18 thus causes the counter 30 to be loaded with a number N which is in the counter 28. Initially, this number will be equal to $N_o$.

The next clock pulse (i.e. the fourth pulse following the setting of the flip flop 12) will set the flip flop 20, which causes a pulse to pass to its Q output. This pulse is fed to the clock input of the flip flop 22, thus causing the flip flop 22 to be set. This state is held until the next reset signal is received. The Q output of the flip flop 22 is connected to an input of an inverting input OR gate 24 and to an input of an inverting input OR gate 26. The output of the clock 15 is connected to the other input of the OR gate 24, and the output of the OR gate 24 is connected to the count down input of the counter 30. Thus, after the flip flop 22 is set, inverted clock pulses will be passed through the OR gate 24 to the counter 30, causing the counter 30 to count down one for every clock 15 pulse.

After the counter 30 has counted down to zero, it generates a pulse which clocks a flip flop 36. The Q output of the flip flop 36 is connected to the D input of a flip flop 38, which is clocked by the first pulse from the clock 15 which occurs after the flip flop 36 has been set. The $\overline{Q}$ output of the flip flop 38 is connected to the inverted reset input of the flip flop 36 and to an input of the OR gate 40. Thus, a short pulse will appear at the Q output of the flip flop 38 (i.e. the flip flop 38 will be clocked and the $\overline{Q}$ output will then reset the flip flop 36, causing the Q output of the flip flop 36 and thus the D input of the flip flop 38 to go to "0"). The negative going pulse from the $\overline{Q}$ output of the flip flop 38 will cause the state of the OR gate 40 to change (the input to the OR gate 40 from the flip flop 18 at this point is "1"), which, through the inverter 42, will cause the counter 30 to be loaded again with the number N in the counter 28. The counter 28 is continuously counted down (as will be described later) and the number N will therefore have changed and no longer be equal to $N_o$. The counter 30 is then counted down again, and when it reaches zero the flip flop 36 is clocked and another pulse is generated at the output of the flip flop 38. The Q output of the flip flop 38 is labeled $f_{sc}$ and represents the desired swept clock frequency output of the system.

From the above discussion, it is apparent that the timing of each output pulse of the flip flop 38 is a function of the number N which is loaded into the counter 30. Initially N will equal $N_o$ and an output pulse will be generated after $N_o$ pulses from the clock 15 have been counted by the counter 30. Subsequently, the counter 28 will be counted down, thus decreasing N, which in turn decreases the time it takes the counter 30 to count to zero. The time period between output pulses will thus be decreasing as a function of the decreasing value of N.

The value of the number N in the counter 28 is controlled by controlling the rate of counting of the counter 28. In order to do this, a second clock 48 whose output frequency is labeled $f_{slope}$ is utilized. The frequency $f_{slope}$ is a constant frequency that determines the rate of change of the swept clock output frequency $f_{sc}$. The output of the clock 48 is used to clock a rate multiplier 32. The input to the rate multiplier 32 is the number N from the counter 28. The rate multiplier 32 is conventional in the art, and its output frequency $f_1$ may be expressed as $$f_1 = f_{slope} \times N/P$$

where p is a known constant for the rate multiplier 32. The output of the rate multiplier 32 is not symmetrical, i.e. the periods between output pulses are not equal. The output pulses are used to clock a second rate multiplier 34, which is identical to the rate multiplier 32 (i.e. P is the same and N is the input). The output frequency $f_2$ of the rate multiplier 34 is $$f_2 = f_{slope} \times N^2/P^2$$

Since the output of the rate multiplier 32 is also not symmetrical, a frequency divider 35 is used to smooth out its output. The frequency divider 35 gives one pulse out for every two hundred and fifty-six pulses in from the rate multiplier 34, thus providing a more nearly symmetrical output (this is because although the period between adjacent pulses is not equal, the period between two hundred and fifty-six pulses is much more nearly equal. The output frequency $f_{cn}$ of the frequency divider 35 is thus $$f_{cn} = f_{slope}(N^2/P^2 \cdot 1/256)$$

Each output pulse from the frequency divider 35 clocks a flip flop 44, the Q output of which is connected to the D input of a flip flop 46. The flip flop 46 is clocked by the clock 15, and serves to synchronize the output of the flip flop 44 with the clock 15. The $\overline{Q}$ output of the flip flop 46 is connected to the inverted reset input of the flip flop 44, an input of the OR gate 26, and the count down input of the counter 28. Due to the resetting of the flip flop 44, the output of the flip flop 46 will be a negative pulse of short duration. This causes the counter 28 to count down one and resets the rate multipliers 32 and 34 and the frequency divider 35 through the OR gate 26 (the other input to the OR gate 26, from the flip flop 22, is at "1" at this time). The number N in the counter 28 thus decreases at a rate equal to the frequency of pulses from the slip flop 46. This rate may be controlled by varying the value of $f_{slope}$. Thus the value of N may be decreased at a known rate. Since the variation in the value of N causes a variation in the output frequency $f_{sc}$, the rate of change of the output frequency, i.e. the sweep rate, is determined by the value of $f_{slope}$. This rate may thus be controlled by adjusting $f_{slope}$. The next reset signal clears the flip flops 10, 14, 16, 18, 20 and 22, thus readying the circuit to receive a new value of $N_o$. In the present embodiment of the invention a new value of $N_o$ is loaded into the counter 28 each time a new article is measured.

The operational theory of the above described circuit is as follows. A variable Y which changes linearly with time may be expressed as:

$$Y = Y_0 + bt$$

where $Y_0$ is the initial value of Y, b is the rate of change of Y and t is time. The inverse of Y, denoted as M, is thus $$1/Y = M = 1/Y_o + bt \tag{1}$$

This equation may be rewritten as $$t = 1/b(1/M - Y_o) \quad (2)$$

Differentiating t with respect to M results in the following:

$$dt/dM = -(1/bM^2) \quad (3)$$

If a constant C is divided by M, a linearly changing variable is again obtained:

$$C/M = C(Y_o + bt) \quad (4)$$

The above relationships may be utilized to generate a frequency which varies linearly with time. This may be done by providing a variable which follows the relationship of equation (3), and dividing a constant frequency by that variable in order to obtain a relationship as in equation (4). In the circuit of FIG. 1, the number N in the counter 28 corresponds to the variable M in the equations above, while the frequency $f_{base}$ corresponds to the constant C. Initially, the frequency output $f_{cn}$ of the frequency divider 35 has been shown to be $$f_{cn} = f_{slope}(N^2/P^2 \cdot 1/256)$$

This frequency is applied to the counter 28 through the flip flops 44 and 46. The period $T_K$ of any particular pulse from the frequency divider 35 is $$T_k = 256P^2/f_{slope}(N_o - k)^2$$

where k is the number of periods which have previously elapsed. Since the number N decreases by one for each successive period, the change in elapsed time versus the change in N is as follows:

$$\Delta t_k/\Delta N = 256P^2/f_{slope}(N_o-k)^2 \quad (5)$$

That is, each time N decreases by one, the elapsed time increases by the time of that particular period. Equation (5) may be compared to equation (3) to confirm that the variable N in the counter 28 corresponds to the variable M. The difference in sign between the two equations may be accounted for by controlling the direction of the counter 28. Both 1/b and $256P^2/f_{slope}$ are constants and thus affect slope only (thus $f_{slope}$ may be chosen to reflect a desired rate of change in the output frequency of the system). Finally, the value $N_o - k$ is seen to be the digital analog to the variable M. Therefore, the equations (3) and (5) correspond, confirming that the circuit of FIG. 1 provides a digital signal whose value varies at the desired rate. In addition, the counter 30 operates to divide the constant frequency $f_{base}$ by the variable N. The output frequency of the counter 30 (and therefore the output frequency $f_{sc}$ of the flip flop 38) thus follows equation (4) and varies linearly with time. Thus, a linearly changing swept clock frequency is obtained.

What is claimed is:

1. Apparatus for generating a swept clock frequency having a linear rate of change, comprising:
   a counter;
   means for clocking said counter comprising:
   a first rate multiplier, said first rate multiplier, having an input from said counter;
   constant frequency generator means for clocking said first rate multiplier;
   a second rate multiplier, said second rate multiplier being clocked by the output of said first rate multiplier and having an input from said counter; and
   a frequency divider for dividing the output of said second rate multiplier, wherein the output of said frequency divider is utilized to clock said counter.

2. The apparatus of claim 1 wherein said constant frequency generator means for controlling the rate of change of said linearly changing swept clock frequency.

3. The apparatus of claim 2 wherein said controlling means includes means for providing one of a plurality of different constant frequency signals to clock said first rate multiplier.

4. Apparatus for generating a swept clock frequency which is proportional to a particular linearly changing time dependent variable, comprising:
   a presettable counter for storing an initial digital signal and said means for changing the value of digital signal which includes:
   a first rate multiplier having as its input the output of said counter;
   means for generating a constant frequency signal to the clock input of said first rate multiplier;
   a second rate multiplier having as its input the output of said counter, said second rate multiplier being clocked by the output of said first rate multiplier;
   a frequency divider having as its input the output of said second rate multiplier, and means for successively dividing said constant frequency signal by said changing digital signal, thereby obtaining a swept output frequency which is proportional to said variable.

* * * * *